United States Patent
Ramaraju et al.

(10) Patent No.: US 7,440,335 B2
(45) Date of Patent: Oct. 21, 2008

(54) CONTENTION-FREE HIERARCHICAL BIT LINE IN EMBEDDED MEMORY AND METHOD THEREOF

(75) Inventors: Ravindraraj Ramaraju, Austin, TX (US); Bradford D. Hunter, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 67 days.

(21) Appl. No.: 11/438,890

(22) Filed: May 23, 2006

(65) Prior Publication Data

US 2007/0280030 A1 Dec. 6, 2007

(51) Int. Cl.
*G11C 7/10* (2006.01)

(52) U.S. Cl. ............... 365/189.02; 365/63; 365/230.02; 365/230.03; 365/230.06

(58) Field of Classification Search ............ 365/63, 365/51, 204, 230.02, 230.03, 230.06, 189.02
See application file for complete search history.

(56) References Cited

U.S. PATENT DOCUMENTS

| | | | |
|---|---|---|---|
| 4,727,519 A | 2/1988 | Morton et al. | |
| 4,839,862 A * | 6/1989 | Shiba et al. | 365/154 |
| 5,008,856 A * | 4/1991 | Iwahashi | 365/185.17 |
| 5,077,693 A | 12/1991 | Hardee et al. | |
| 6,515,887 B2 * | 2/2003 | Fujimoto | 365/63 |
| 6,728,125 B2 | 4/2004 | Hong | |
| 2003/0090944 A1 * | 5/2003 | Shimizu et al. | 365/200 |
| 2003/0090951 A1 * | 5/2003 | Yokozeki | 365/230.03 |
| 2004/0042295 A1 * | 3/2004 | Fujiwara et al. | 365/202 |
| 2005/0207242 A1 * | 9/2005 | Yabe | 365/200 |

OTHER PUBLICATIONS

Jan M. Rabaey et al., Digital Integrated Ciruits, Prentice Hall, 2003, 1996 by Pearson Education, Inc., Second Edition, pp. 180-183, 274-275.*
Wuu, John et al.; "The Asynchronous 24MB On-Chip Level-3 Cache for a Dual-Core Itanium-Family Processor"; IEEE International Solid-State Circuits Conference; 2005; pp. 488, 489 and 618.
Dhong, Sang H. et al.; "A 4.8GHz Fully Pipelined Embedded SRAM in the Streaming Processor of a Cell Processor"; IEEE International Solid-State Circuits Conference; 2005; pp. 486, 487,612.
Ebergen, Jo et al.; "GasP Control For Domino Circuits"; Sun Microsystems Laboratories.
Weiss, Don et al.; "The On-Chip 3-MB Subarray-Based Third-Level Cache on an Italian Microprocessor"; IEEE Journal of Solid-State Circuits, vol. 37, No. 11, Nov. 2002.
U.S. Appl. No. 11/362,694, filed Feb. 26, 2006.

* cited by examiner

*Primary Examiner*—Huan Hoang
*Assistant Examiner*—Fernando N Hidalgo

(57) ABSTRACT

A memory includes a plurality of lower level bit lines, a higher level bit line, and bit line driving circuitry. The bit line driving circuitry includes a plurality of bit line inputs, each bit line input coupled to a corresponding one of the plurality of lower level bit lines. The bit line driving circuitry further includes a first select input to receive a first select value, a second select input to receive a second select value, and an output configured to drive a select one of first bit value or a second bit value at the third bit line based on the first select value and the second select value and a bit value of at least one of the plurality of lower level bit lines.

8 Claims, 9 Drawing Sheets

US 7,440,335 B2

CONTENTION-FREE HIERARCHICAL BIT LINE IN EMBEDDED MEMORY AND METHOD THEREOF

FIELD OF THE DISCLOSURE

The present disclosure is related generally to memories and more particularly to hierarchical bit lines for memories.

BACKGROUND

Memories frequently are structured in a hierarchical manner whereby each memory array sector bit line is driven by multiple global bit lines. Each global bit line in turn is driven by multiple local bit lines. Bit line driving circuitry therefore is used to permit each bit line at one level to carry a bit value from one of a number of bit lines at a lower level. Conventional bit line driving circuitry typically is dynamic circuitry using clock signaling to avoid contention issues between two or more bit lines for control of a higher-level bit line.

Memories employing a hierarchical bit line structure typically are configured such that the routing and configuration of metal routes proximate to higher-level bit lines (e.g., metal routes in the substrate layers above or below a global bit line) are uncontrolled. As a result, noise emanating from the proximate metal routes can result in spurious operation of a higher-level bit lines due to their dynamic operation and reliance on keeper circuitry. A noise-tolerant technique for contention-free access to a higher-level bit line by two or more lower-level bit lines therefore would be advantageous.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

Figure 1:
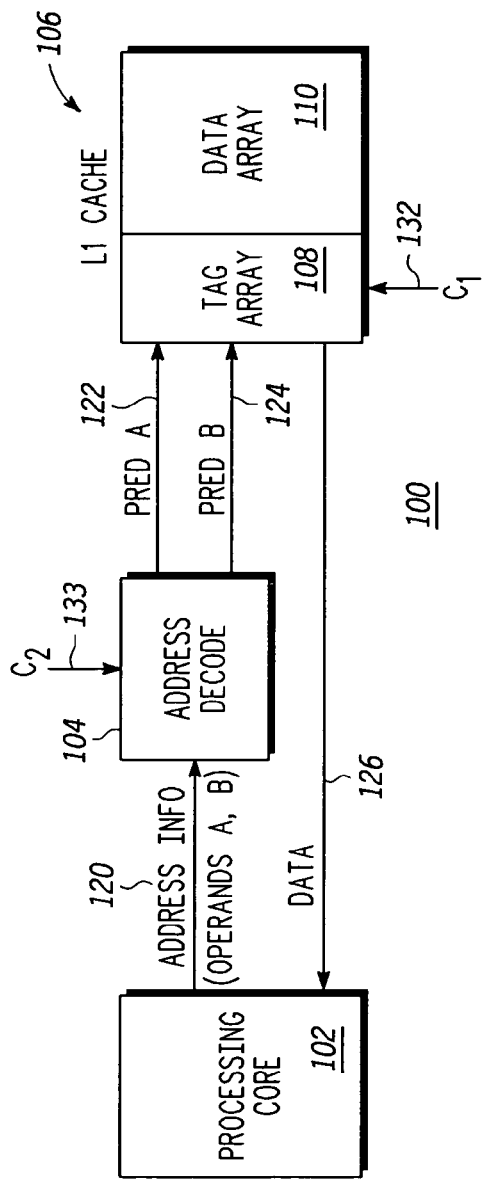
FIG. 1 is a block diagram illustrating an exemplary processing system implementing asynchronous memory precharging in accordance with at least one embodiment of the present disclosure.

In accordance with one aspect of the present disclosure, a memory includes a plurality of lower level bit lines, a higher level bit line, and bit line driving circuitry. The bit line driving circuitry includes a plurality of bit line inputs, each bit line input coupled to a corresponding one of the plurality of lower level bit lines. The bit line driving circuitry further includes a first select input to receive a first select value, a second select input to receive a second select value, and an output configured to drive a select one of first bit value or a second bit value at the third bit line based on the first select value and the second select value and a bit value of at least one of the plurality of lower level bit lines.

In accordance with another aspect of the present disclosure, a memory includes a first bit line, a second bit line, and a third bit line. The memory further includes a first transistor having a first current-carrying electrode connected to a first voltage reference, a second current-carrying electrode, and a control electrode to receive a representation of a first select value and a second transistor having a first current-carrying electrode connected to the second current-carrying electrode of the first transistor, a second current-carrying electrode connected to the third bit line, and a control electrode connected to the first bit line. The memory further includes a third transistor including a first current-carrying electrode connected to the third bit line, a second current-carrying electrode connected to a second voltage reference, and a control electrode connected to the first bit line, and a fourth transistor including a first current-carrying electrode connected to the first voltage reference, a second current-carrying electrode, and a control electrode to receive a second select value. The memory additionally includes a fifth transistor including a first current-carrying electrode connected to the second current-carrying electrode of the fourth transistor, a second current-carrying electrode connected to the third bit line, and a control electrode connected to the second bit line, and a sixth transistor including a first current-carrying electrode connected to the third bit line, a second current-carrying electrode connected to the second voltage reference, and a control electrode connected to the second bit line.

In accordance with an additional aspect of the present disclosure, a method is provided for a memory including a first bit line and a second bit line coupled to a third bit line. The method includes receiving a plurality of bit line values, each bit line value from a corresponding lower level bit line of a plurality of lower level bit lines. The method further includes driving a select one of a first bit value or a second bit value onto a higher level bit line based on a first select value associated with a first of the plurality of lower level bit lines and a second select value associated with a second of the plurality of lower level bit lines and based on the first bit line value and the second bit line value. In one embodiment, driving a select one of the first bit value or the second bit value onto the higher level bit line includes driving the first bit value onto the higher level bit line responsive to the first select value comprising a first value and the second select value comprising a second value, the second value different than the first value, and driving the second bit value onto the higher level bit line responsive to the first select value comprising the second value and the second select value comprising the first value. Further, the first select value can include a first bit value of an address predecode value and the second select value can include a second bit value of the address predecode value.

FIGS. 1-6 illustrate exemplary techniques for precharging a memory component. Address information, such as a base address and an offset value, is used to generate predecode values. The predecode values are latched based on a first clock. The latched predecode values then are used to directly terminate the precharging of a specified local bit line, as well as a global bit line, of a memory component without waiting for a clock edge event (e.g., a rising clock edge), thereby reducing or eliminating timing bubbles in memory access processing due to memory precharging requirements.

FIGS. 7-12 illustrate exemplary techniques for driving bit lines in a hierarchical manner. Bit line driving circuitry connecting two or more bit lines to a higher-level bit line is configured so that the bit value on the enabled lower-level bit line is statically driven onto the higher-level bit line while also avoiding contention issues between two or more lower-level bit lines being driven onto a higher-level bit line, thereby making the higher-level bit line less susceptible to noise compared to dynamically driven hierarchical bit line structures. Further, in one embodiment, the precharging techniques illustrated by FIGS. 1-6 may be implemented in the techniques of FIGS. 7-12. Alternatively, conventional precharging techniques can be used.

Although the exemplary techniques are described herein in the context of a tag array of a data cache for use in a processing device for ease of illustration, those skilled in the art can implement the disclosed techniques in other memory components, such as embedded memory, external memory, and the like, without departing from the scope of the present disclosure.

FIG. 1 illustrates an exemplary processing system 100 utilizing bit line precharging in accordance with one embodiment of the present disclosure. The processing system 100 represents any of a variety of processing systems that utilize memory to store information. Exemplary implementations of the system 100 include an integrated circuit device, such as a microprocessor or microcontroller, a multiple-chip design, such as a personal computer motherboard, and the like. For ease of illustration, the processing system 100 is discussed herein in the context of an integrated circuit device comprising an embedded data cache.

As illustrated, the processing system 100 includes a processing core 102, an address decode module 104, and a level 1 (L1) data cache 106 connected via one or more busses. The L1 data cache 106 includes a tag array 108 and a data array 110. In operation, the processing core 102 accesses the L1 data cache 106 to obtain stored data for use while executing instructions. As part of the access process, the processing core 102 provides address information 120 associated with the cache access to the address decode module 104 for predecoding. The address information 120 includes two or more operands, such as operands A and B. The operands A and B, in one embodiment, include a base address and an offset value that are used by a memory management unit (MMU) (not shown) to calculate an effective address used to access the L1 data cache 106.

In response to receiving the operands A and B of the address information 120, the address decode module 104 generates two or more predecode values, including pred A and pred B. An exemplary method for generating values for pred A and pred B from operands A and B is described in U.S. patent application Ser. No. 11/257,932 (U.S. Patent App. Pub. No. 2007/0094479 A1), entitled "SYSTEM AND METHOD FOR MEMORY ARRAY WITH FAST ADDRESS DECODER" and filed on Oct. 25, 2005, the entirety of which is incorporated by reference herein.

The address decode module 104 provides the pred A and pred B values to the tag array 108 as signal 122 and signal 124, respectively. The tag array 108 completes the predecoding of the address information 120 by activating a word line based on the pred A and pred B values. A method for generating the effective address based on the pred A and pred B values is described in U.S. patent application Ser. No. 11/257,932, cited above. The tag array 108 then compares the tag data stored at the tag memory location associated with the effective address to determine whether the requested data is stored in the data array 110. If so, the requested data is provided from the L1 data cache 106 to the processing core 102 as signal 126.

It will be appreciated that the tag array 108 and the data array 110 perform high speed sensing and therefore utilize memory precharging during read accesses for proper bit value detection at the output drivers (not shown) of the tag array 108 and the data array 110. However, as opposed to conventional techniques in which a clock edge or clock phase change serves as the trigger for terminating the precharging once the corresponding bit line is identified, the processing system 100, in one embodiment, utilizes the pred A or pred B values to asynchronously terminate precharging (i.e., without waiting for a clock edge event as a trigger) of the corresponding bit line identified by the pred A and pred B values. As illustrated, the tag array 108 receives a clock signal 132 (clock $C_1$) and the address decode module 104 receives a clock signal 133 (clock $C_2$), where the clock signal 133, in one embodiment, is a substantially inverted representation of clock signal 132. As described in greater detail herein with reference to FIG. 2, the address decode module 104 utilizes the clock signal 133 to control the predecoding of the operands A and B to generate the pred A and B values and further to control the latching of the pred A and B values. Once latched, the pred values A and B precharging of a corresponding bit line at the tag array 108 is terminated directly responsive to at least one of the pred A value or the pred B value. The tag array 108 then uses the clock signal 132 to control the latching of the tag value identified by the effective address calculated from the pred A and pred B values. Thus, rather than relying on the clock signal 132 to trigger the termination of the precharge of the tag array 108, the tag array 108 can utilize the pred A and B values to identify the appropriate bit lines and terminate the precharging process as soon as the pred A and B values are latched. By reducing the reliance on the clock signal 132, the tag array 108 can more quickly access the appropriate bit lines and therefore make the corresponding tag data available sooner than compared to conventional synchronous precharging techniques.

Figure 2:
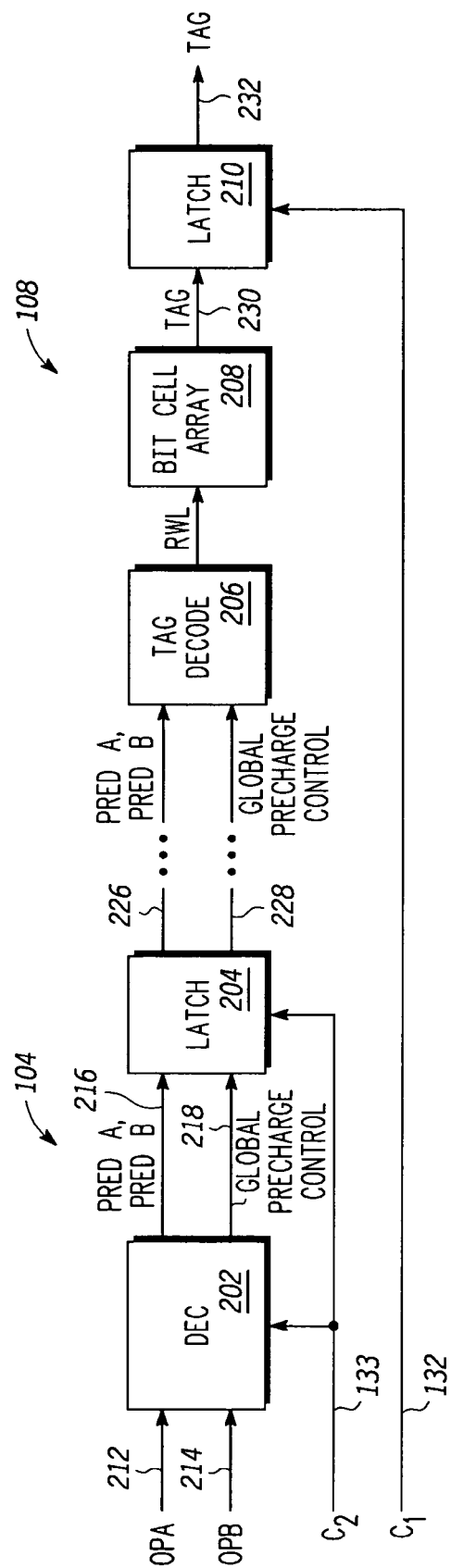
FIG. 2 is a block diagram illustrating an exemplary asynchronous memory precharging system in accordance with at least one embodiment of the present disclosure.

Referring to FIG. 2, the asynchronous precharging system utilized by the processing system 100 is illustrated in greater detail in accordance with at least one embodiment of the present disclosure. In the depicted example, the address decode module 104 includes a decode module 202 and a latch 204 and the tag array 108 includes a tag decode module 206, a bit cell array 208 and a latch 210. The decode module 202 has inputs to receive operands A (signal 212) and B (signal 214), respectively, and an input to receive clock signal 133 (clock $C_2$). The decode module 202 further has an output to provide the pred A and B values (signal 216) generated by the decode module 202 from the operand A and B values and an output to provide a global precharge control signal 218. The global precharge control signal 218 serves to control the precharging of a global bit line of the tag array 108 as described herein. The latch 204 includes a latch input to receive the operand A and B values, a latch input to receive the global precharge control signal 218, a control input to receive the clock signal 133, and outputs to provide latched pred A and B values (signal 226) and a latched global precharge control signal 228 responsive to the clock signal 133. The latch 204 may include a dynamic latch, a static latch, a cheater latch, and the like.

The tag decode module 206 includes an input to receive the pred A and pred B values (signal 226), an input to receive the latched global precharge control signal 228, and an output to provide a read word line (RWL) identifier corresponding to an address value determined from the pred A and pred B values. The bit cell array 208 includes an input to receive the RWL identifier, a plurality of rows of bit cells corresponding to a plurality of read word lines, and an output to provide a tag value (signal 230) stored at the row of bit cells corresponding the RWL identifier received at the input. The latch 210 includes a latch input to receive the tag value, a control input to receive the clock signal 132, and an output to provide a latched tag value (signal 232) responsive to the clock signal 132.

As FIG. 2 illustrates, the operation of the decode module 202 to generate the pred A and B values is controlled by the clock signal 133, as is the latching of the pred A and B values by the latch 204. However, as also illustrated, the precharging of the latched bit cell array 208 is directly responsive to only the latched pred A and B values and the global precharge control signal 228 without relying on a clock signal to serve as the precharge trigger.

Figure 3:
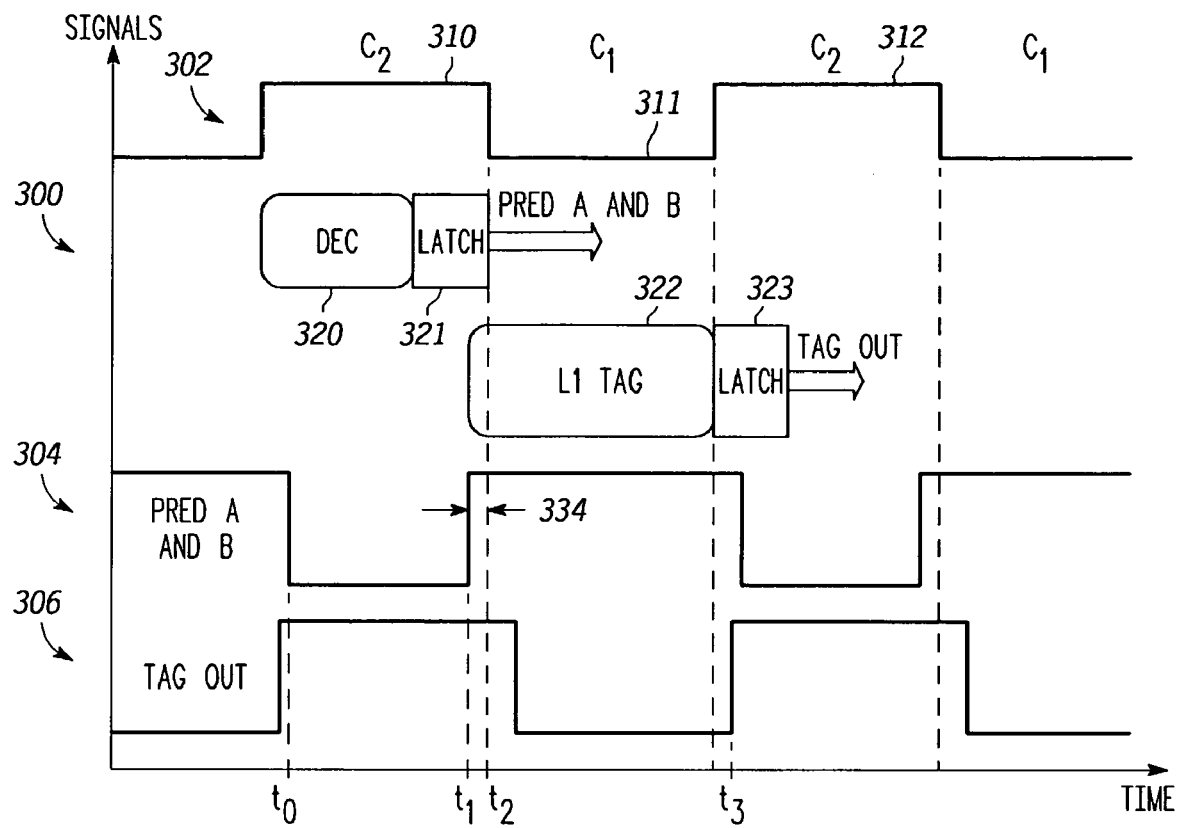
FIG. 3 is a timing diagram illustrating an exemplary local bit line and global bit line precharging scheme in accordance with at least one embodiment of the present disclosure.

Referring to FIG. 3, a timing diagram 300 illustrating an exemplary operation of the precharging system of FIG. 2 is illustrated in accordance with at least one embodiment of the present disclosure. The timing diagram 300 includes clock signal 302 representing clock signal 132 and clock signal 133, a predecode signal 304 representing the generation of pred A and B values for a series of cache accesses, and a tag out signal 306 representing the determination of the tag value in response to the pred A and pred B values.

As illustrated during clock phase 310 where the clock signal 133 is high and the clock signal 132 is low precharging of the bit lines begins at time $t_0$ and the decode module 202 (FIG. 2) generates the pred A and pred B values at duration 320. The latch 204 (FIG. 2) latches the pred A and pred B values at duration 321 of clock phase 310. The latched pred A and B values become available to the tag decode module 206 (FIG. 2) at time $t_1$ of duration 321 prior to the edge event at the end of clock phase 310. In response to the output of the pred A and pred B values by the latch 204, the bit cell array 208 (FIG. 2) ends the precharging of one or more bit lines identified by at least one of the pred A and B values at duration 322. At duration 322, the tag decode module 206 continues to determine the effective address identifying the corresponding storage location of the bit cell array 208 and, once identified, the tag value stored in the identified storage location is output to the latch 210 (FIG. 2). At time $t_3$ of duration 323, the latch 210 latches the tag value in response to the edge event between clock phases 311 and 312 and provides the latched tag value for output, where the latched tag value is used to determine whether the corresponding storage location of the data array 110 (FIG. 1) stores the requested data. Thus, rather than comprising to wait for the edge event at time $t_2$ as in conventional precharging schemes, the tag decode module 206 can cease precharging as soon as the latched values are available at time $t_1$, thereby reducing or eliminating the time lag 334 between when the latched pred A and B values become available (time $t_1$) and when the edge event occurs (time $t_2$).

Figure 4:
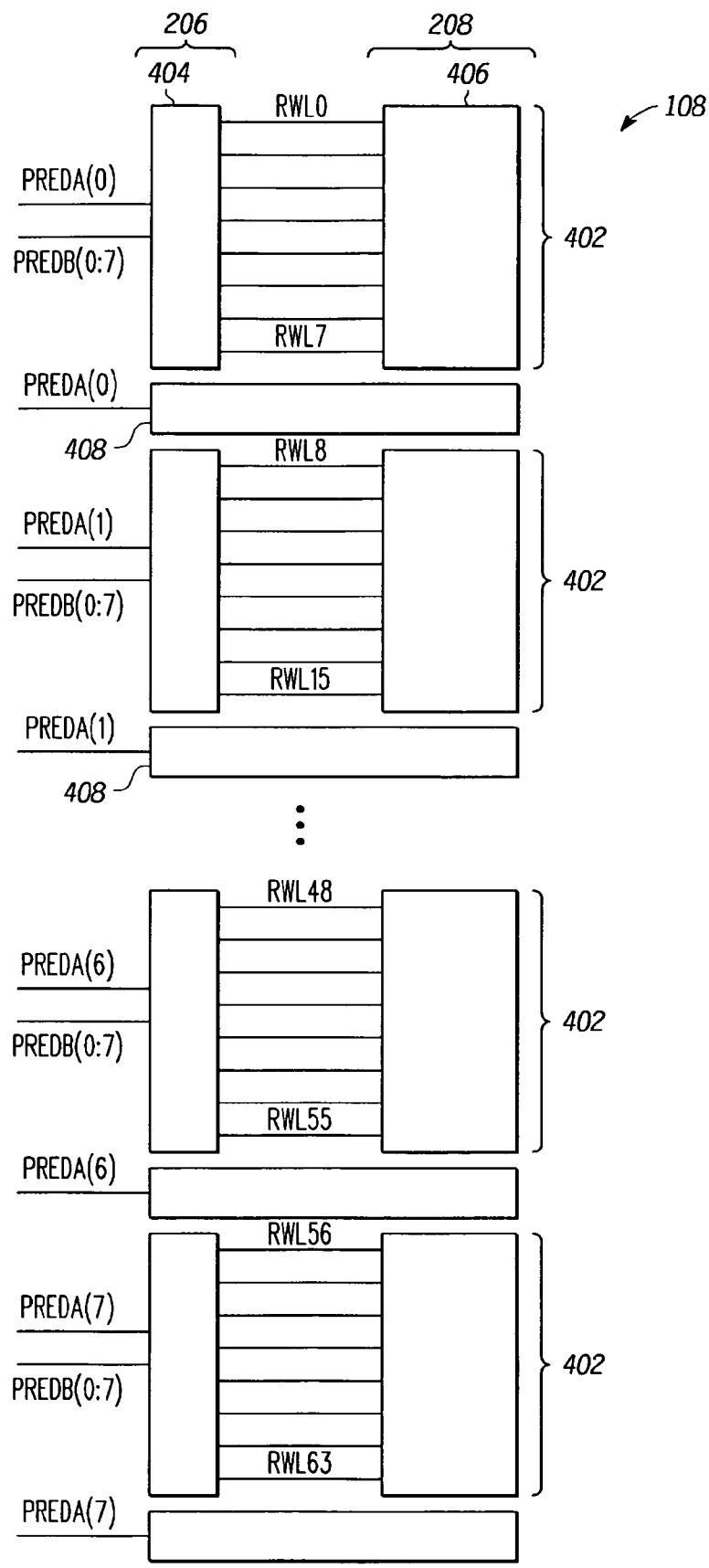
FIG. 4 is a diagram illustrating an exemplary memory component in accordance with at least one embodiment of the present disclosure.
Figure 5:
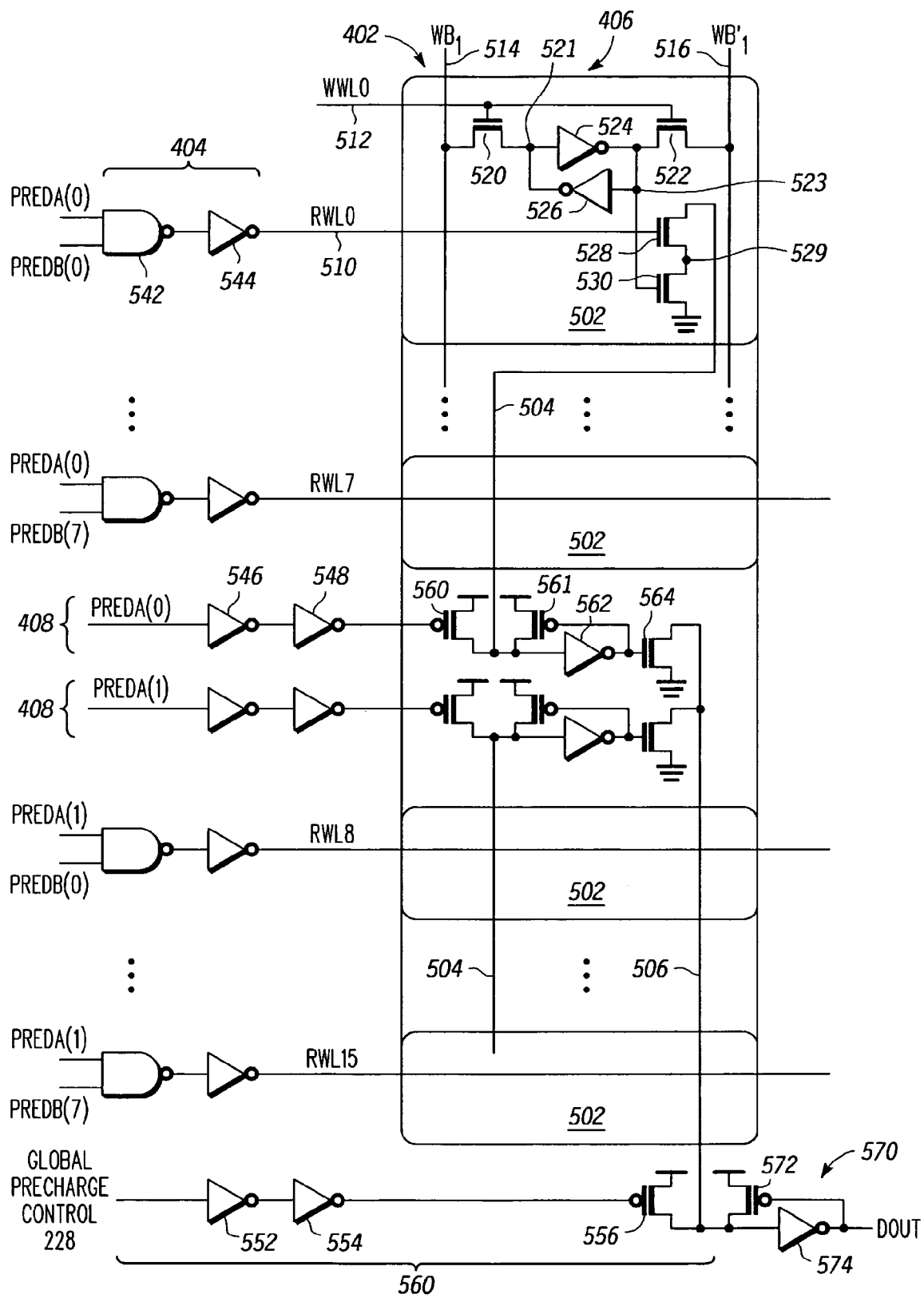
FIG. 5 is a diagram illustrating an exemplary implementation of the memory component of FIG. 4 in accordance with at least one embodiment of the present disclosure.

Referring to FIGS. 4 and 5, an exemplary implementation of the tag array 108 is illustrated in accordance with at least one embodiment of the present disclosure. As depicted by FIG. 4, the tag array 108 may be partitioned into a plurality of memory blocks 402, where each memory block 402 includes a tag decode module 404 and a bit cell module 406. Each tag decode module 404 receives a corresponding predecode bit pred A[x] and n bit values from pred B[0:n-1] from which a corresponding plurality of read word lines (RWLs) are controlled. To illustrate in the context of FIG. 4, the pred A and B values are eight-bit values (pred A[0:7] and pred B[0:7]), where the first memory block 402 receives pred A[0] and pred B[0:7] to control RWLs 0-7, the second memory block 402 receives pred A[1] and pred B[0:7] to control RWLs 8-15, and so on. The tag array 108 further comprises a plurality of precharge modules 408, where each precharge module 408 receives a corresponding bit value from the pred A value. To illustrate, the first precharge module receives pred A[0], the second precharge module receives pred A[1], and so on.

In the depicted example, each of the pred A and B values are one hot values so that only one bit position of each value is asserted. As each of the memory blocks 402 receives a different bit of the pred A value, the asserted bit of the pred A value identifies the corresponding memory block 402 that is to be accessed for a read operation. In a similar manner, the multiple bit values of the one hot pred B value are utilized to determine which read word line of the identified memory block 402 is to be asserted. To illustrate, assume that the pred A[0:7] has a value of x01000000 (i.e., pred A[1] is asserted), where the second memory block 402 receives pred A[1] at its input. Further assume that pred B[0:7] has a value of x0000100 (i.e., pred B[5] is asserted). In this example, because the tag decode module 404 of the second memory block 402 is triggered due to pred A[1] being asserted, the tag decode module 404 is activated and, in response, asserts RWL 5, which corresponds to the asserted pred B[5] bit position.

In addition to identifying the memory block and read word line associated with the read operation, the pred A value also serves to directly trigger the termination of the precharging of the appropriate bit line. As the pred A value is a one hot value, only one of the precharge modules 408 receives an asserted value. Accordingly, each of the precharge modules 408 is configured to cease precharging of the local bit line of the corresponding memory block in response to an assertion of its corresponding bit value of the pred A value. To illustrate, assume that pred A[0:7] has a value of x10000000 (i.e., the pred A[0] bit value is asserted), where the first memory block 402 and the first precharge module 408 receives pred A[0] at its input. In this example, the first precharge module 408 would cease precharging of the local bit line of the first memory block 402 in response to receiving the asserted pred A[0] bit value.

FIG. 5 illustrates the implementation of FIG. 4 in greater detail. In the depicted example, each bit cell module 406 of the memory block 402 includes a plurality of rows of bit cells 502. Each row of bit cells 502 is connected to a corresponding read word line (e.g., RWL0) of the memory block 402. Further, each column of bit cells 502 of the bit cell module 402 is connected to a corresponding local bit line 504. Each local bit line 504 in turn is connected to a corresponding global bit line 506. Each global bit line 506 is connected to an output driver 570 that determines a stored bit value based on a voltage or current carried on the global bit line 506. In the illustrated example, the output driver 570 includes: a transistor 572 comprising a first current-carrying electrode connected to the global bit line 506, a second current-carrying electrode connected to a voltage reference (e.g., Vcc), and a control electrode connected to the output (DOUT) of the output driver 570; and an inverter 574 comprising an input connected to the global bit line 506 and an output connected to the output (DOUT) of the output driver 570.

In the illustrated example, each bit cell 502 comprises an eight transistor (8T) bit cell connected to a write word line (WWL) 512, a read word line (RWL) 510, write bit lines 514 (Wb$_1$) and 516 (Wb$_1$'), and the corresponding local bit line 504. Thus, the bit cell 502 includes: a transistor 520 comprising a control electrode connected to the write word line 512, a first current-carrying electrode connected to the write bit line 514, and a second current-carrying electrode connected to node 521; a transistor 522 comprising a control electrode connected to the write word line 512, a first current-carrying electrode connected to the write bit line 516, and a second current-carrying electrode connected to a node 523; an inverter 524 comprising an input connected to the node 521 and an output connected to the node 523; an inverter 526 comprising an input connected to the node 523 and an output connected to the node 521; a transistor 528 comprising a control electrode connected to the read word line 510, a first current-carrying electrode coupled to node 529 and a second current-carrying electrode connected to the local bit line 504; and a transistor 530 comprising a control electrode connected to node 523, a first current-carrying electrode connected to node 529 and a second current-carrying electrode connected to a voltage reference (e.g., ground).

As FIG. 5 illustrates, the tag decode module 404 can be implemented as combinatorial logic, where each bit pair (pred A[x], pred B[n]) is input to a corresponding NAND gate 542 and the output of the NAND gate is input to an inverter, which in turn is used to assert and deassert a corresponding read word line. To illustrate, the first memory block 404 receives the values pred A[0] and pred [0:7], where pred A[0] and pred[0] are input to the NAND gate 542 and the output of the NAND gate 542 is provided to the inverter 544, which in turn controls the read word line 510 (RWL0). Thus, when bit values pred A[0] and pred B[0] are asserted for the one hot pred A and B values, the output of the inverter 544 will be asserted, thereby asserting the read word line 510. Likewise, when either of the bit values pred A[0] and pred B[0] are not asserted, the output of the inverter 544 will be not be asserted, so the read word line 510 will not be asserted. Further, in certain instances, a read enable signal may be utilized to control read accesses. Accordingly, the NAND gate 542 further may include a third input to receive the read enable signal so that the output of the NAND gate is negated only when the read enable signal is asserted.

As FIG. 5 further illustrates, the precharge modules 408 also can be implemented as combinatorial logic. In the depicted example, each precharge module 408 includes: an inverter 546 comprising an input to receive a corresponding bit value of the pred A value and an output; an inverter 548 comprising an input connected to the output of the inverter 546 and an output; a p-channel transistor 560 comprising a control electrode connected to the output of the inverter 548, a first current-carrying electrode connected to a voltage reference (e.g., Vcc) and a second current-carrying electrode connected to the local bit line 504; an inverter 562 comprising an input connected to the local bit line 504 and an output; a keeper transistor 561 comprising a first current-carrying electrode connected to a voltage reference (e.g., Vcc), a second current-carrying electrode connected to the input of the inverter 562 and a control electrode connected to the output of the inverter 562; and a transistor 564 comprising a control electrode connected to the output of the inverter 562, a first current-carrying electrode connected to a voltage reference (e.g., ground), and a second current-carrying electrode connected to the global bit line 506. Thus, the transistor 560 ceases current flow between its current-carrying electrodes in direct response to only the assertion of the corresponding bit value of the pred A value, thereby allowing the local bit lines 504 to carry the value stored in the bit cell 502. It will be appreciated that the precharge module 408 includes the same configuration for the other local bit lines of the memory block 502.

In addition to asynchronously terminating precharging the local bit lines of the memory block 402 to be accessed, a global precharge module 560 is used to asynchronously terminate precharging of the global bit lines 506 of the tag array 108 in response to an assertion of the global precharge control signal 228 (FIG. 2). In one embodiment, the precharge control signal 228 is asserted whenever any of the pred A bit positions are asserted (i.e., whenever the pred A value is not zero). Thus, the global precharge control signal 218 can be generated as, for example, the output of an OR gate (or a hierarchy of OR gates) comprising an input for each of the bit positions of the pred A value. In the depicted example, the global precharge module 560 is implemented as combinatorial logic, including: an inverter 552 comprising an input to receive the global precharge control signal 218 and an output; an inverter 554 comprising an input connected to the output of the inverter 552 and an output; and a p-channel transistor 556 comprising a control electrode connected to the output of the inverter 554, a first current-carrying electrode connected to a voltage reference (e.g., Vcc), and a second current-carrying electrode connected to the global bit line 506. It will be appreciated that the inverters 552 and 554 serve to match the delay introduced by the NAND gate 542 and the inverter 544 for use in asserting the corresponding read word line. Thus, when the global precharge control signal 228 is asserted, the transistor 556 denying the flow of current between its current-carrying electrodes, thereby allowing the global bit line 506 to carry the value on the local bit line 504.

Figure 6:
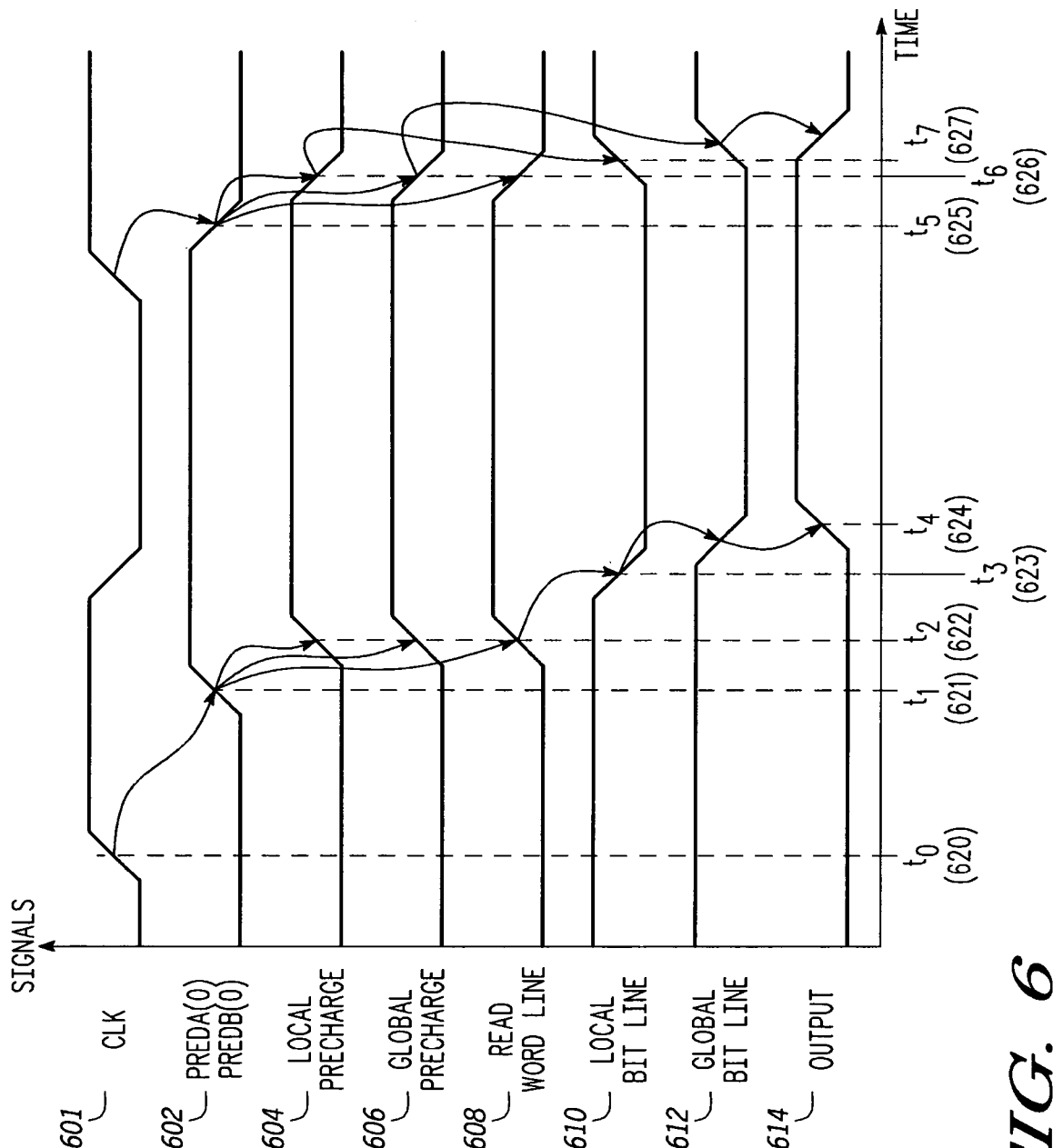
FIG. 6 is a timing diagram illustrating an exemplary operation of the memory component implementation of FIG. 5 in accordance with at least one embodiment of the present disclosure.

Referring to FIG. 6, a timing diagram 600 illustrating an exemplary operation of the implementation of FIGS. 4 and 5 is illustrated in accordance with at least one embodiment of the present disclosure. The timing diagram 600 includes a signal 601 representative of the clock signals 132 and 133 (FIG. 1), signal 602 representative of the assertion of the pred A and pred B values, a signal 604 (active low) representative of the precharging of local bit lines of a memory block, a signal 606 (active low) representative of the precharging of global bit lines of the memory block, a signal 608 representative of the assertion of a read word line of the memory block, a signal 610 representative of the output of the values of a row of bit cells onto the corresponding local bit lines, a signal 612 representative of the transfer of the values from the local bit lines to the global bit lines, and a signal 614 representative of the output of a tag value resulting from sense amplification of the global bit lines.

At time $t_0$ (time 620), an edge event (e.g., a rising edge) of the clock signal (signal 601) enables the generation of the pred A and pred B values. Prior to time $t_1$, the local and global bit lines are precharged. At time $t_1$ (time 621), the pred A and B values are latched and, in response, the precharging of the local bit lines and the global bit lines of the memory block identified by the pred A value is asynchronously terminated at time $t_2$ (time 622) the corresponding read word line identified by the pred A value is asserted. At time $t_3$ (time 623), the values of each of the bit cells along the row corresponding to the asserted read word line are transferred to a corresponding precharged bit line and at time $t_4$ (time 624), the values on the local bit lines are transferred to the corresponding global bit lines and provided as an output.

At time $t_5$ (time 625), the pred A and B values are pulled low or unasserted and, in response, the precharging process for the local and global bit lines begins at time $t_6$ (time 626). Thereafter, the local bit lines and global bit lines are precharged at time $t_7$ (time 627) and, consequently, the output of the tag array 108 is deasserted or pulled low.

Figure 7:
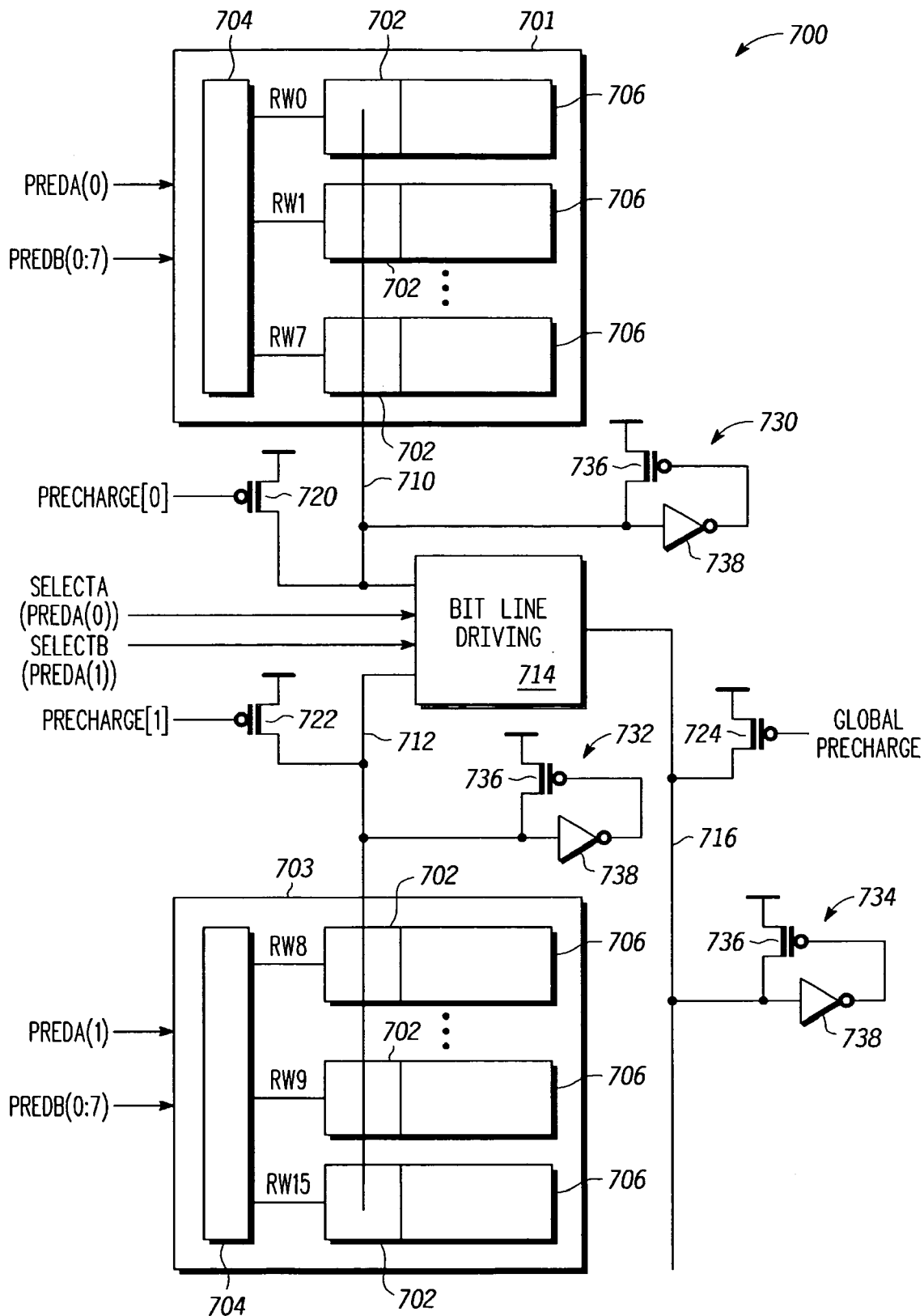
FIG. 7 is a block diagram illustrating an exemplary hierarchical bit line structure of a memory in accordance with at least one embodiment of the present disclosure.

Referring to FIG. 7, an exemplary hierarchical bit line structure for a memory is illustrated in accordance with at least one embodiment of the present disclosure. For ease of illustration, the memory is described in the context of a tag array 700 of a cache, such as the tag array 108 of the L1 cache 106 of FIGS. 1-6. However, those skilled in the art can implement the hierarchical bit line techniques described herein in other memory architectures without departing from the scope of the present disclosure.

In the depicted example, the tag array 700 is partitioned into a plurality of memory blocks, such as memory block 701 and 703, wherein each memory block is associated with a different bit of the pred A value. Each memory block includes a tag decode module 704 (e.g., tag decode modules 404, FIG. 4) having an input to receive a corresponding bit of the pred A value (e.g., pred A[0] for the memory block 701 and pred A[1] for the memory block 703) and an input to receive some or all of the bits of the pred B value (e.g., pred B[0:7]). The tag decode module 704 further includes a plurality of outputs, each output connected to a corresponding read word line (RWL), wherein the tag decode module 704 can activate one of the read word lines by asserting the corresponding output based on pred A[0] and pred B[0:7]. The tag array 700 further includes a plurality of bit cell modules 706 (e.g., bit cell modules 406, FIG. 4). Each bit cell module 706 includes a row of bit cells connected to a corresponding read word line. Further, each column of bit cells of the memory blocks 701 and 703 is connected to a corresponding local bit line. In the example of FIG. 7, the bit cell 702 of each of the bit cell modules 706 of the memory block 701 is connected to a local bit line 710 and the bit cell 702 of each of the bit cell modules 706 of the memory block 703 is connected to a local bit line 712.

The tag array 700 further includes bit line driving circuitry 714 having an input connected to the local bit line 710, an input connected to the local bit line 712, an input to receive a select A value, an input to receive a select B value, and an output connected to a global bit line 716 (e.g., global bit line 506, FIG. 5). The bit line driving circuitry 714 acts similar to a multiplexer to provide a selected one of the bit line value on the bit line 710 or the bit line value on the bit line 712 based on the select A value and the select B value. In one embodiment, the select A value is the bit of the pred A value provided to the tag decode module 704 of the memory block 701 (e.g., pred A[0]) and the select B value is the bit of the pred A value provided to the tag decode module 704 of the memory block 703 (e.g., pred A[1]).

The tag array 700 further includes precharge circuitry to precharge the local bit lines 710 and 712 and the global bit line 716. To illustrate, the precharge circuitry for the local bit line 710 includes a transistor 720 (e.g., a p-channel transistor) having a first current-carrying electrode connected to a voltage reference (e.g., $V_{CC}$), a second current-carrying electrode connected to the local bit line 710, and a control electrode to receive a first precharge control value (bit precharge[0]). Similarly, the precharge circuitry for the local bit line 712 includes a transistor 722 having a first current-carrying electrode connected to the voltage reference, a second current-carrying electrode connected to the local bit line 712, and a control electrode to receive a second precharge control value (bit precharge[1]). Likewise, the precharge circuitry for the global bit line 716 includes a transistor 724 having a first current-carrying electrode connected to the voltage reference, a second current-carrying electrode connected to the global bit line 716, and a control electrode to receive a global precharge control value.

In one embodiment, the first precharge control value provided to the transistor 720 and the second precharge control value provided to the transistor 722 include precharge control values asynchronously generated using the techniques described above with respect to FIGS. 1-6. Likewise, the global precharge value provided to the transistor 724 can include the global precharge control signal 228 (FIG. 2). Alternately, the first precharge control value, the second precharge control value and the global precharge control value can include precharge control signals generated using conventional precharging techniques. Further, in one embodiment, the tag array 700 includes keeper circuits 730, 732 and 734 to maintain a logic high value on the local bit line 710, the local bit line 712, and the global bit line 716, respectively, when they are not being evaluated. In the illustrated example, the keeper circuits 730, 732 and 734 each include an inverter 738 having an input connected to the corresponding bit line and a p-channel transistor 736 having a current electrode connected to a voltage reference, a current electrode connected to the corresponding bit line and a control electrode connected to the output of the inverter 738.

In operation, the tag decode modules 704 of the memory blocks 701 and 703 receive the pred B value and corresponding bit of the pred A value. As noted above, the pred A value and the pred B value are one hot values. Accordingly, only one read word line for both memory blocks 701 and 703 can be asserted at any given time (or not at all if both pred A[0] and pred B[0] are unasserted). In response to an asserted read word line, the bit cell 702 connected to the asserted read word line drives its stored value onto the corresponding local bit line. To illustrate, in response to the assertion of the read word line RW0, the bit cell 702 of the first bit cell module 706 of the memory block 701 drives its stored value onto the local bit line 710. Likewise, in response to the assertion of the read word line RW8, the bit cell 702 of the first bit cell module 706 of the memory block 703 drives its stored value onto the local bit line 712.

The bit line driving circuitry 714 drives a select one of the bit line value of the local bit line 710 or the bit line value of the local bit line 712 onto the global bit line 716 based on the select A value (e.g., pred A[0]) and the select B value (e.g., pred A[1]). In one embodiment, the select A value, the select B value and the bit line driving circuitry 714 are configured so that the bit line value on the local bit line 710 is driven onto the global bit line 716 when a read word line of the memory block 701 is asserted based on the pred A value and the pred B value and the bit line value on the local bit line 712 is driven onto the global bit line 712 when a read word line of the memory block 703 is asserted based on the pred A value and the pred B value. Further, as described in greater detail with reference to FIGS. 8-12, the bit line driving circuitry 714, in one embodiment, continuously drives one of the bit line values onto the global bit line without use of a clock signal or other timing control, thereby reducing spurious operation of the global bit line 716 due to noise.

Figure 8:
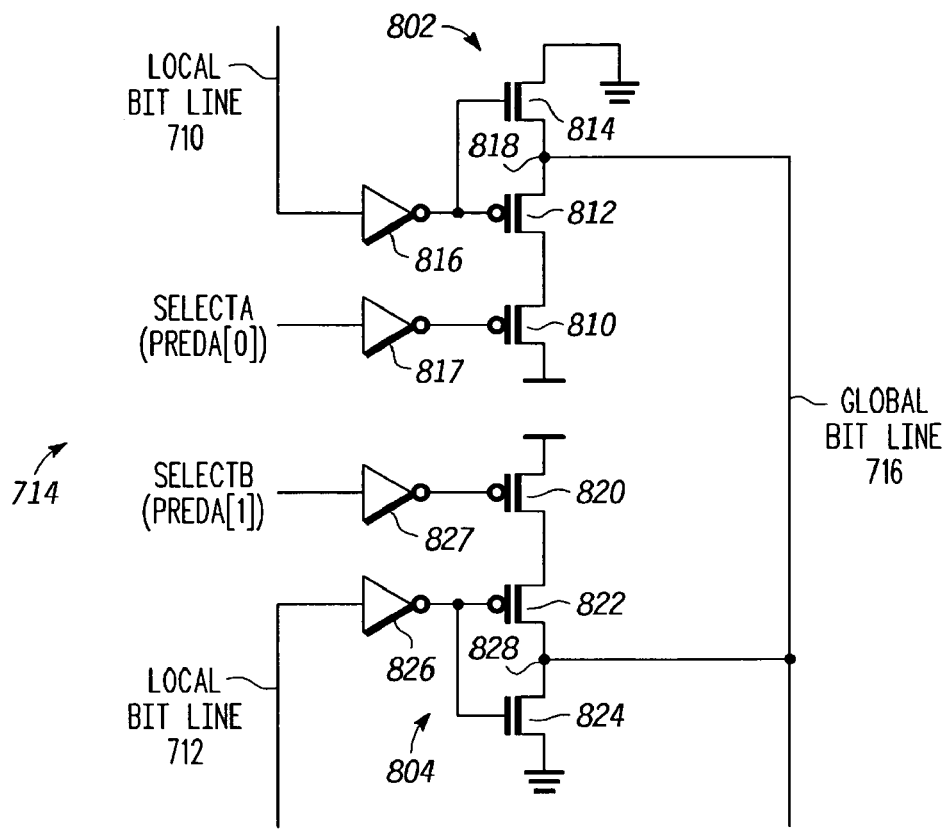
FIG. 8 is a circuit diagram illustrating an exemplary implementation of bit line driving circuitry of FIG. 7 in accordance with at least one embodiment of the present disclosure.

Referring to FIG. 8, an exemplary implementation of the bit line driving circuitry 714 is illustrated in accordance with at least one embodiment of the present disclosure. In the depicted example, the bit line driving circuitry 714 includes driving circuitry 802 for the local bit line 710 and driving circuitry 804 for the local bit line 712. In the illustrated example, the transistors 810 and 812 are transistors of a first conductivity type (e.g., p-channel transistors) and the transistor 814 is a transistor of a second conductivity type (e.g., an n-channel transistor). The inverter 816 includes an input connected to the local bit line 710 and an output to provide an inverted representation of the bit line value at the local bit line 710. The inverter 817 includes an input to receive the select A value (e.g. pred A[0]) and an output to provide an inverted representation of the select A value. The transistor 810 includes a first current-carrying electrode connected to a first voltage reference (e.g., $V_{CC}$), a second current-carrying electrode, and a control electrode connected to the output of the inverter 817. The transistor 812 includes a first current-carrying electrode connected to the second current-carrying electrode of the transistor 810, a second current-carrying electrode connected to a node 818, and a control electrode connected to the output of the inverter 816. The node 818, in turn, is connected to the global bit line 716. The transistor 814 includes a first current-carrying electrode connected to the node 818, a second current-carrying electrode connected to a second voltage reference (e.g., GND), and a control electrode connected to the output of the inverter 816.

The driving circuitry 804 includes transistors 820, 822 and 824, and inverters 826 and 827. In the illustrated example, the transistors 820 and 822 are p-channel transistors and the transistor 824 is an n-channel transistor. The inverter 826 includes an input connected to the local bit line 712 and an output to provide an inverted representation of the bit line value at the local bit line 712. The inverter 827 includes an input to receive the select B value (e.g. pred A[1]) and an output to provide an inverted representation of the select B value. The transistor 820 includes a first current-carrying electrode connected to the first voltage reference, a second current-carrying electrode, and a control electrode connected to the output of the inverter 827. The transistor 822 includes a first current-carrying electrode connected to the second current-carrying electrode of the transistor 820, a second current-carrying electrode connected to a node 828, and a control electrode connected to the output of the inverter 826. The node 828, in turn, is connected to the global bit line 716. The transistor 824 includes a first current-carrying electrode connected to the node 828, a second current-carrying electrode connected to the second voltage reference, and a control electrode connected to the output of the inverter 826.

In operation, the local bit lines 710 and 712 and the global bit line 716 are precharged to high logic value. The driving circuitry 802 and 804 together select at most one of the bit line value of the local bit line 710 or the local bit line 712 for output on the global bit line 716 based on pred A[0] and pred A[1] (embodiments of the select A value and the select B value, respectively). When pred A[0] is asserted and the local bit line 710 evaluates to a logic 1 value, the transistors 810 and 812 are enabled in response, thereby pulling the node 818 to the first voltage reference (e.g., $V_{CC}$), which results in the global bit line 716 evaluating the a logic 1 value. When pred A[0] is asserted and the local bit line 710 evaluates to a logic 0 value, the transistor 812 is disabled and the transistor 814 is enabled in response, thereby pulling the node 818 to the second voltage reference (e.g., GND), which results the global bit line 716 evaluating to a logic 0 value. The driving circuitry 804 operates in the same manner with respect to the pred A[1] value and the local bit line 712. Accordingly, it will be appreciated that the transistor 810 and the transistor 820 act to reduce or eliminate contention between the local bit lines 710 and 712 based on the select A and select B values (or inverted representations thereof) that are received at their respective control gates.

Figure 9:
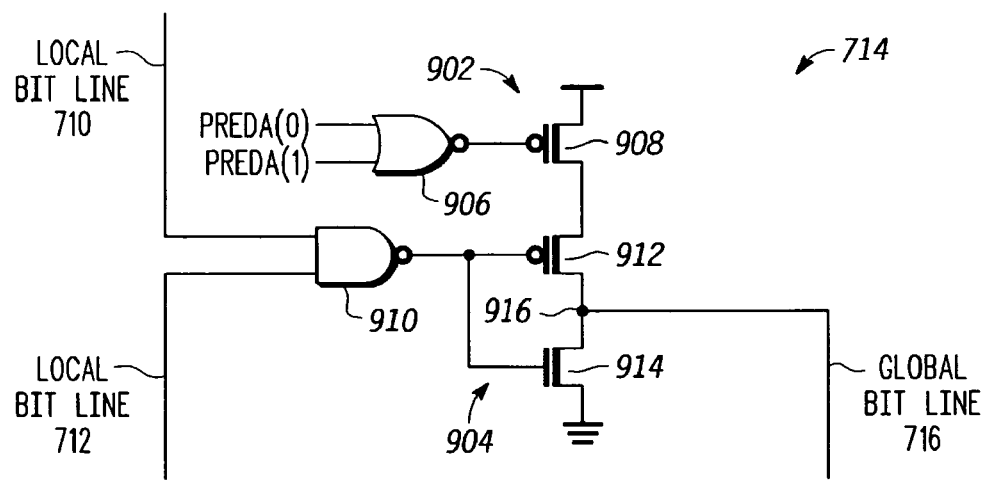
FIG. 9 is a circuit diagram illustrating another exemplary implementation of the bit line coupling circuitry of FIG. 7 in accordance with at least one embodiment of the present disclosure.

Referring to FIG. 9, another exemplary implementation of the bit line driving circuitry 714 is illustrated in accordance with at least one embodiment of the present disclosure. In the depicted example, the bit line driving circuitry 714 includes enable circuitry 902 and driving circuitry 904.

The enable circuitry 902 includes a NOR gate 906 and a transistor 908. The NOR gate 906 has a first input to receive pred A[0] (one embodiment of the select A value), a second input to receive pred A[1] (one embodiment of the select B value), and an output to provide an output value representing a NOR logic function on pred A[0] and pred A[1]. The transistor 908 includes a first current-carrying electrode connected to the first voltage reference, a second current-carrying electrode connected to the driving circuitry 904, and a control electrode connected to the output of the NOR gate 906. In the illustrated example, the transistor 908 is a p-channel transistor.

The driver circuitry 904 includes a NAND gate 910 and transistors 912 and 914. The NAND gate 910 includes a first input connected to the local bit line 710, a second input connected to the local bit line 712, and an output to provide a value representative of a NAND logic function on the bit line values of the local bit lines 710 and 712. The transistor 912 includes a first current-carrying electrode connected to the second current-carrying electrode of the transistor 908 of the enable circuitry 902, a second current-carrying electrode connected to a node 916, and a control electrode connected to the output of the NAND gate 910. The node 916, in turn, is connected to the global bit line 716. The transistor 914 includes a first current-carrying electrode connected to the node 916, a second current-carrying electrode connected to the second voltage reference, and a control electrode connected to the output of the NAND gate 910. In the illustrated example, the transistor 912 is a p-channel transistor and the transistor 914 is an n-channel transistor.

When either the local bit line 710 or the local bit line 712 evaluates to a logic 0 value, the output of the NAND gate 910 is asserted, thereby enabling the transistor 914 and disabling the transistor 912, which results in the global bit line 716 evaluating to a logic 0 value. Otherwise, when both local bit lines 710 and 712 evaluate to a logic 1 value, the output of the NAND gate 910 is unasserted, thereby disabling the transistor 914 and enabling the transistor 912. If the transistor 908 also is enabled (i.e., when one of pred A[0] or pred A[1] is asserted), the node 916 is pulled up to the first voltage reference, and the global bit line 716 consequently evaluates to a logic 1 value. Accordingly, it will be appreciated that the circuit represented by the NOR gate 902 and the transistor 908 reduces or eliminates contention between the local bit lines 710 and 712 based on the values of pred A[0] and pred A[1].

Figure 10:
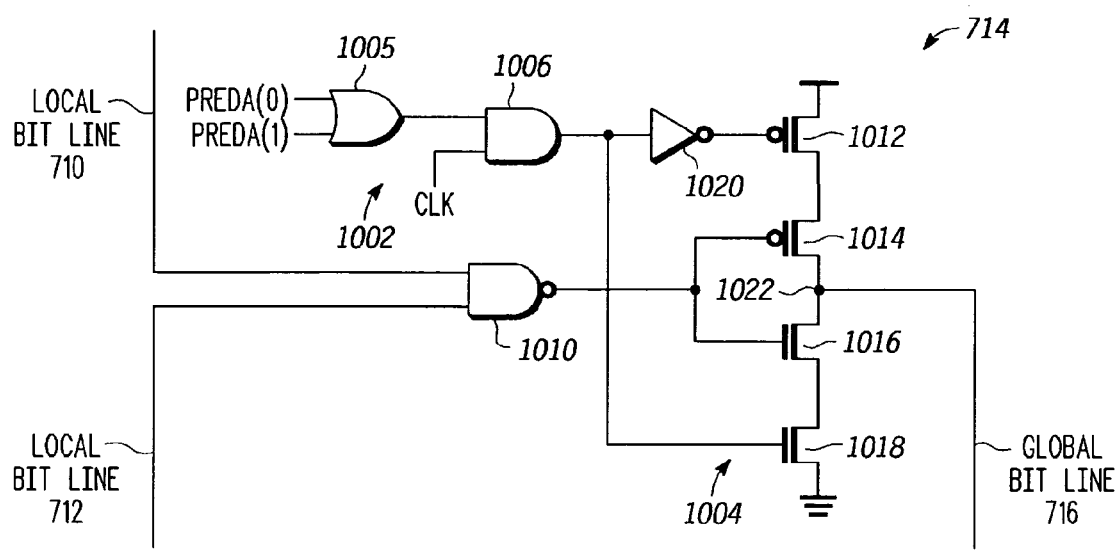
FIG. 10 is a circuit diagram illustrating yet another exemplary implementation of the bit line coupling circuitry of FIG. 7 in accordance with at least one embodiment of the present disclosure.

Referring to FIG. 10, yet another exemplary implementation of the bit line driving circuitry 714 is illustrated in accordance with at least one embodiment of the present disclosure. In the depicted example, the bit line driving circuitry 714 includes enable circuitry 1002 and driving circuitry 1004.

The enable circuitry 1002 includes an OR gate 1005 and an AND gate 1006. The OR gate 1005 includes a first input to receive pred A[0], a second input to receive pred A[1], and an output to provide a representation of an OR logic operation on pred A[0] and pred A[1]. The AND gate 1006 includes a first input connected to the output of the OR gate 1005, a second input to receive a clock (CLK) signal, and an output to provide a representation of an AND logic operation on the output of the OR gate 1005 and the CLK signal.

The driving circuitry 1004 includes a NAND gate 1010, transistors 1012, 1014, 1016 and 1018, and an inverter 1020. In the illustrated example, the transistors 1012 and 1014 are p-channel transistors and the transistors 1016 and 1018 are n-channel transistors. The NAND gate 1010 has a first input connected to the local bit line 710, a second input connected to the local bit line 712, and an output to provide a representation of a NAND logic operation on the bit line values carried by the local bit lines 710 and 712. The inverter 1020 has an input connected to the output of the AND gate 1006 and an output to provide an inverted representation of the output of the AND gate 1006. The transistor 1012 includes a first current-carrying electrode connected to the first voltage reference, a second current-carrying electrode, and a control electrode connected to the output of the inverter 1020. The transistor 1014 includes a first current-carrying electrode connected to the second current-carrying electrode of the transistor 1012, a second current-carrying electrode connected to a node 1022, and a control electrode connected to the output of the NAND gate 1010. The node 1022, in turn, is connected to the global bit line 716. The transistor 1016 includes a first current-carrying electrode connected to the node 1022, a second current-carrying electrode, and a control electrode connected to the output of the NAND gate 1010. The transistor 1018 includes a first current-carrying electrode connected to the second current-carrying electrode of the transistor 1016, a second current-carrying electrode connected to the second voltage reference, and a control electrode connected to the output of the AND gate 1006.

When either of pred A[0] or pred A[1] is asserted and the CLK signal is asserted, the transistors 1012 and 1018 are enabled, thereby enabling the driving circuitry 1004. Otherwise, if neither of pred A[0] and pred A[1] is asserted or if the CLK signal is deasserted, the transistors 1012 and 1018 are disabled, thereby allowing the global bit line 716 to be preconditioned to a logic 1 value by the transistor 724 (FIG. 7).

When the driving circuitry 1004 is enabled and either of local bit lines 710 or 712 evaluates to a logic 0 value, the transistor 1016 is enabled and the transistor 1014 is disabled, causing the node 1022 to be pulled to the second voltage reference and thereby causing the global bit line 716 to evaluate to a logic 0 value. Otherwise, when the driving circuitry 1004 is enabled and both of the local bit lines 710 and 712 evaluate to a logic 1 value, the transistor 1014 is enabled and the transistor 1016 is disabled, which causes the node 1022 to be pulled to the first voltage reference, thereby causing the global bit line 716 to evaluate to a logic 1 value. Thus, the transistors 1012 and 1018 serve to reduce or eliminate contention between the local bit lines 710 and 712 based on pred A[0] and pred A[1].

It will be appreciated that the application of the AND function to pred A[0] and pred B[0] with the CLK signal can serve to effectively resynchronize the signals with the same clock that controls the global bit line precharge signal 228 (FIG. 7). Further, this logic AND function reduces the clock switching power expended on transistors 1012 and 1018. In the event that the global bit line precharge signal 228 were asserted (active low) and either pred A[0] or pred B[0] were asserted active high, the transistor 914 could effectively short circuit with the global bit line precharge device represented by the transistor 724 (FIG. 7). To avoid this short circuit contention, pred A[0] and pred B[0] can be effectively resynchronized with the CLK signal to ensure that the output of the AND gate 1006 is asserted only when the CLK signal is high and the global precharge signal 228 also is high (active low). In an alternate implementation, the same effect can be achieved by connecting the CLK signal to the control electrode of the transistor 1018, without requiring use of the AND gate 1006 (in which case the output of the OR gate 1005 would be fed to the input of the inverter 1020).

Figure 11:
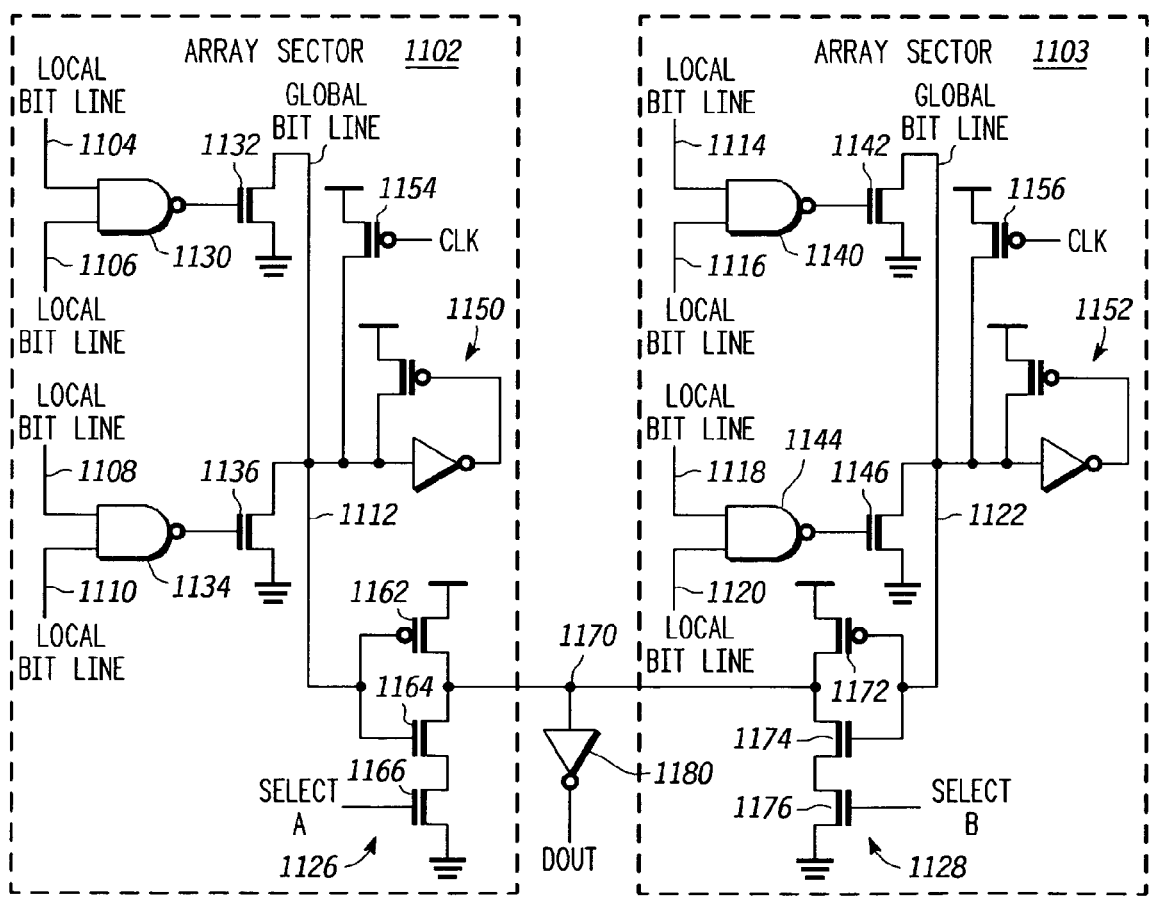
FIG. 11 is a circuit diagram illustrating another exemplary hierarchical bit line structure of a memory in accordance with at least one embodiment of the present disclosure.

It will be appreciated that the bit line coupling techniques described above with reference to FIGS. 7-10 also can be implemented at a higher level in a hierarchical bit line structure for a memory. FIG. 11 illustrates an implementation of the bit line driving technique whereby two or more global bit lines are used to drive a sector bit line. In the depicted example, a memory 1100 is arranged in a plurality of memory array sectors, including memory array sectors 1102 and 1103. Each of the memory array sectors has a plurality of memory blocks, whereby the memory blocks are paired to sets of local bit lines, and the sets of local bit lines in turn are connected to corresponding sets of global bit lines of the memory array sector. To illustrate, for a particular bit cell column (not shown) the memory array sector 1102 includes local bit lines 1104, 1106, 1108 and 1100 connected to a global bit line 1112 and the memory array sector 1103 includes local bit lines 1114, 1116, 1118 and 1120 connected to a global bit line 1122. The global bit lines 1112 and 1122 in turn are connected to a sector bit line 1170 via driving circuitry 1126 and 1128, respectively.

In the depicted example, the local bit lines 1104 and 1106 are connected to the global bit line 1112 via a NAND gate 1130 and a transistor 1132, and the local bit lines 1108 and 1110 are connected to the global bit line 1112 via a NAND gate 1134 and a transistor 1136. Similarly, the local bit lines 1114 and 1116 are connected to the global bit line 1122 via a NAND gate 1140 and a transistor 1142, and the local bit lines 1118 and 1120 are connected to the global bit line 1122 via a NAND gate 1144 and a transistor 1146. Further, the memory array sector 1102 can include keeper circuitry 1150 for the global bit line 1112 and the memory array sector 1103 can include keeper circuitry 1152 for the global bit line 1122.

Additionally, in one embodiment, the memory array sectors 1102 and 1103 employ clock-based global bit line precharging. To illustrate, the memory array sector 1102 can include a transistor 1154 having a first current-carrying electrode connected to first voltage reference (e.g., $V_{CC}$), a second current-carrying electrode connected to the global bit line 1112, and a control electrode to receive a clock (CLK) signal. The precharging circuitry for the global bit line 1122 can be similarly configured using a transistor 1156.

The driving circuitry 1126 includes transistors 1162, 1164 and 1166. In the illustrated embodiment, the transistor 1162 is a p-channel transistor and the transistors 1164 and 1166 are n-channel transistors. The transistor 1162 includes a first current-carrying electrode connected to the first voltage reference, a second current-carrying electrode connected to a sector bit line 1170, and a control electrode connected to the global bit line 1112. The sector bit line 1170, in turn, is connected to an output driver (represented as, for example, an inverter 1180). The transistor 1164 includes a first current-carrying electrode connected to the sector bit line 1170, a second current-carrying electrode, and a control electrode connected to the global bit line 1112. The transistor 1166 includes a first current-carrying electrode connected to the second current-carrying electrode of the transistor 1164, a second current-carrying electrode connected to a second voltage reference (e.g., GND), and a control electrode to receive a select A value. The driving circuitry 1128 is similarly configured for the global bit line 1122 and a select B value using transistors 1172, 1174 and 1176.

As noted above, each local bit line typically is associated with a corresponding bit of the pred A value and the pred B value. Accordingly, in one embodiment, the select A value and the select B value are not different bits of the pred A value. Rather, the select A value and the select B value on hot values determined generated from a higher order address term that distinguishes between array sector 1102 and array sector 1103, whereas the pred A and pred B values, in one embodiment, are generated from lower order address terms for selecting between local read word lines.

It will be appreciated that the driver circuitry 1126 acts as an inverter for the bit line value on the global bit line 1112 and the driver circuitry 1128 acts as an inverter for the bit line value on the global bit line 1122. Accordingly, an inverter 1180 is implemented to output the value at the sector bit line 1170 so as to invert the output of the driver circuitry 1126/1128. To prevent contention between the global bit lines 1112 and 1122, the select A value and the select B value are configured so that only one of the driver circuitry 1126 or the driver circuitry 1128 can be enabled at any given time.

Figure 12:
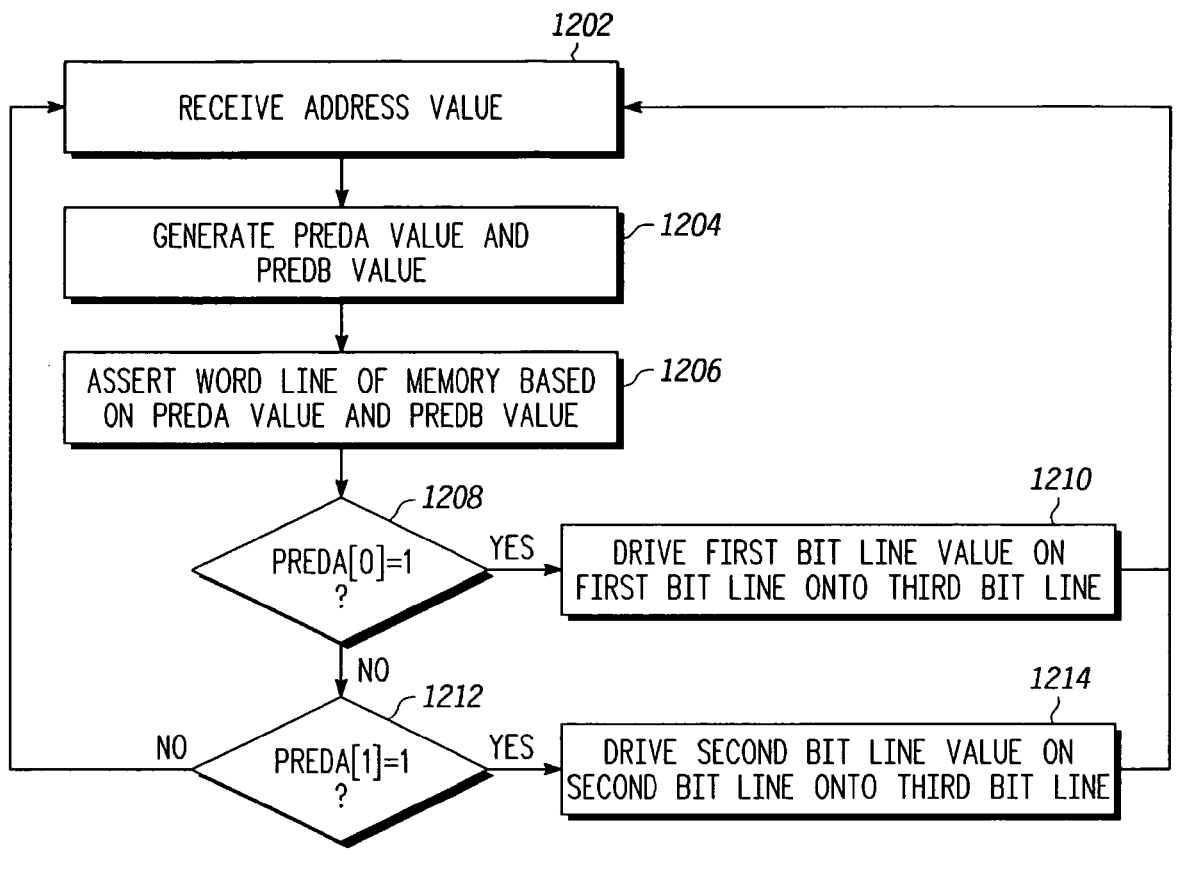
FIG. 12 is a flow diagram illustrating an exemplary method for driving multiple lower-level bit lines onto a higher-level bit line in accordance with at least one embodiment of the present disclosure.

Referring to FIG. 12, an exemplary method 1200 for driving two or more lower-level bit lines onto a higher-level bit line is illustrated in accordance with at least one embodiment of the present disclosure. The method 1200 includes receiving an address value at a memory at block 1202. The address value represents a corresponding location of the memory from which stored data is to be read. The memory includes a first bit line associated with a first set of bit cells, a second bit line associated with a second set of bit cells, and a third bit line connected to the first and second bit lines. For example, the first and second bit lines can include local bit lines (e.g., local bit lines 710 and 712, FIG. 7) and the third bit line can include a global bit line (e.g., global bit line 716, FIG. 7).

At block 1204, a pred A value and a pred B value are generated from the address value. In response to the pred A value and the pred B value, a read word line of the memory is asserted at block 1206. The asserted read word line can be associated with the first set of bit cells, the second set of bit cells, or another set of bit cells that are not associated with the first or second bit lines. For this example, it is assumed that pred A[0] is associated with the first bit line and pred A[1] is associated with the second bit line. Accordingly, in the event that pred A[0] is asserted, a read word line associated with the first bit line and the first set of bit cells is asserted, and in the event that pred A[1] is asserted, a read word line associated with the second bit line and the second set of bit cells is asserted.

In response to determining that pred A[0] is asserted (e.g., having a logic 1 value) at block 1208, a first bit line value on the first bit line is driven onto the third bit line. Otherwise, in response to determining that pred A[0] is unasserted (e.g., having a logic 0 value) at block 1208 and determining that pred A[1] is asserted at block 1212, a second bit line value on the second bit line is driven onto the third bit line. Otherwise, in the event that neither pred A[0] nor pred A[1] is asserted (thereby indicating that neither of the first set of bit cells nor the second set of bit cells is being accessed), the method 1200 returns to block 1202 for the next address value.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A memory comprising:
   a plurality of lower level bit lines comprising:
     a first bit line and a second bit line;
   a higher level bit line; and
   bit line driving circuitry comprising:
     a plurality of bit line inputs, each bit line input coupled to a corresponding one of the plurality of lower level bit lines;
     a first select input to receive a first select value;
     a second select input to receive a second select value, the second select value separate from the first select value;
     a first transistor comprising a first current-carrying electrode coupled to a first voltage reference, a second current-carrying electrode, and a control electrode to receive a representation of the first select value;
     a second transistor comprising a first current-carrying electrode coupled to the second current-carrying electrode of the first transistor, a second current-carrying electrode coupled to the higher level bit line, and a control electrode to receive a representation of a first bit line value at the first bit line;
     a third transistor comprising a first current-carrying electrode coupled to the higher level bit line, a second current-carrying electrode coupled to a second voltage reference, and a control electrode to receive the representation of the first bit line value;
     a fourth transistor comprising a first current-carrying electrode coupled to the first voltage reference, a second current-carrying electrode, and a control electrode to receive a representation of the second select value;
     a fifth transistor comprising a first current-carrying electrode coupled to the second current-carrying electrode of the fourth transistor, a second current-carrying electrode coupled to the higher level bit line, and a control electrode to receive a representation of a second bit line value at the second bit line;
     a sixth transistor comprising a first current-carrying electrode coupled to the higher level bit line, a second current-carrying electrode coupled to the second voltage reference, and a control electrode to receive the representation of the second bit line value; and
     an output configured to drive a select one of a first bit value or a second bit value at the higher level bit line based on the first select value and the second select value and a bit value of at least one of the plurality of lower level bit lines.

2. The memory of claim 1, wherein:
   the first transistor, the second transistor, the fourth transistor and the fifth transistor are transistors of a first conductivity type; and
   the third transistor and the sixth transistor are transistors of a second conductivity type.

3. The memory of claim 1, wherein:
   the representation of the first select value is an inverted representation of the first select value;
   the representation of the second select value is an inverted representation of the second select value;
   the representation of the first bit line value is an inverted representation of the first bit line value; and
   the representation of the second bit line value is an inverted representation of the second bit line value.

4. The memory of claim 1, further comprising:
a first inverter comprising an input coupled to the first bit line and an output coupled to the control electrode of the second transistor and coupled to the control gate of the third transistor, the output to provide the inverted representation of the first bit line value;
a second inverter comprising an input coupled to the second bit line and an output coupled to the control electrode of the fifth transistor and coupled to the control electrode of the sixth transistor, the output to provide the inverted representation of the second bit line value;
a seventh transistor comprising a first current-carrying electrode coupled to the first voltage reference, a second current-carrying electrode coupled to the first bit line, and a control electrode coupled to the output of the first inverter, wherein the seventh transistor is a transistor of the first conductivity type; and
an eighth transistor comprising a first current-carrying electrode coupled to the first voltage reference, a second current-carrying electrode coupled to the second bit line, and a control electrode coupled to the output of the second inverter, wherein the eighth transistor is a transistor of the first conductivity type.

5. A memory comprising:
a plurality of lower level bit lines;
a higher level bit line; and
bit line driving circuitry comprising:
  a plurality of bit line inputs, each bit line input coupled to a corresponding one of the plurality of lower level bit lines;
  a first select input to receive a first select value;
  a second select input to receive a second select value;
  a NAND gate comprising a first input coupled to a first bit line of the plurality of lower level bit lines, a second input coupled to a second bit line of the plurality of lower level bit lines, and an output;
  a first transistor comprising a first current-carrying electrode coupled to a first voltage reference, a second current-carrying electrode, and a control electrode to receive a control value based on an OR logic operation on a representation of the first select value and a representation of the second select value;
  a second transistor comprising a first current-carrying electrode coupled to the second current-carrying electrode of the first transistor, a second current-carrying electrode coupled to the higher level bit line, and a control electrode coupled to the output of the NAND gate; and
  a third transistor comprising a first current-carrying electrode coupled to the second higher level bit line, a second current-carrying electrode coupled to a second voltage reference, and a control electrode coupled to the output of the NAND gate; and
  an output configured to drive a select one of a first bit value or a second bit value at the third bit line based on the first select value and the second select value and a bit value of at least one of the plurality of lower level bit lines.

6. The memory of claim 5, further comprising:
a NOR gate comprising a first input to receive the first select value, a second input to receive the second select value, and an output coupled to the control electrode of the first transistor.

7. The memory of claim 5, further comprising:
an OR gate comprising a first input to receive the first select value, a second input to receive the second select value, and an output;
an inverter comprising an input coupled to the output of the OR gate and an output coupled to the control electrode of the first transistor; and
a fourth transistor comprising a first current-carrying electrode coupled to the second current-carrying electrode of the third transistor, a second current-carrying electrode coupled to the second voltage reference, and a control electrode to receive a clock signal, wherein the second current-carrying electrode of the third transistor is coupled to the second voltage reference via the fourth transistor.

8. A memory comprising:
a plurality of lower level bit lines;
a higher level bit line; and
bit line driving circuitry comprising:
  a plurality of bit line inputs, each bit line input coupled to a corresponding one of the plurality of lower level bit lines;
  a first select input to receive a first select value;
  a second select input to receive a second select value; an OR gate comprising a first input to receive the first select value, a second input to receive the second select value, and an output;
  an AND gate comprising a first input coupled to the output of the OR gate, a second input to receive a clock signal, and an output; and
  an output configured to drive a select one of a first bit value or a second bit value at the third bit line based on the first select value and the second select value and a bit value of at least one of the plurality of lower level bit lines;
an inverter comprising an input coupled to the output of the AND gate and an output coupled to the control electrode of the first transistor; and
a fourth transistor comprising a first current-carrying electrode coupled to the second current-carrying electrode of the third transistor, a second current-carrying electrode coupled to the second voltage reference, and a control electrode coupled to the output of the AND gate, wherein the second current-carrying electrode of the third transistor is coupled to the second voltage reference via the fourth transistor.

* * * * *